(12) United States Patent
Sumi

(10) Patent No.: US 10,015,920 B2
(45) Date of Patent: Jul. 3, 2018

(54) COMPONENT MOUNTING METHOD IN COMPONENT MOUNTING SYSTEM

(71) Applicant: Panasonic Intellectual Property Management Co., Ltd., Osaka (JP)

(72) Inventor: Hideki Sumi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 212 days.

(21) Appl. No.: 15/140,120

(22) Filed: Apr. 27, 2016

(65) Prior Publication Data

US 2016/0366797 A1    Dec. 15, 2016

(30) Foreign Application Priority Data

Jun. 9, 2015  (JP) ................ 2015-116546

(51) Int. Cl.
*H05K 3/30* (2006.01)
*H05K 13/08* (2006.01)
*H05K 13/04* (2006.01)

(52) U.S. Cl.
CPC ......... *H05K 13/08* (2013.01); *H05K 13/0417* (2013.01); *Y10T 29/49131* (2015.01)

(58) Field of Classification Search
CPC ........ H05K 13/08; H05K 13/02; H05K 3/301; G05B 2219/50386; Y10T 29/4913; Y10T 29/49131; Y10T 29/53174; Y10T 29/49124; Y10T 29/53178
USPC .......... 29/833, 428, 832, 834, 709, 720, 740
See application file for complete search history.

(56) References Cited

U.S. PATENT DOCUMENTS 6,817,216 B2 * 11/2004 Kou ................ H05K 13/021 70/209
6,918,730 B2 *  7/2005 Kawai ............. H05K 13/0417 414/183
9,635,793 B2 *  4/2017 Mizokami ........ H05K 13/0417

FOREIGN PATENT DOCUMENTS

JP   8-181488   7/1996

* cited by examiner

*Primary Examiner* — Thiem Phan
(74) *Attorney, Agent, or Firm* — Pearne & Gordon LLP

(57) ABSTRACT

An external set-up device calculates a shift amount of a supply position of a component which is supplied by a tape feeder that is disposed on the carriage. The storage stores supply position shifting data in which the shift amount of the component supply position is related to a feeder address and a feeder ID. The component mounter compares the feeder ID of the tape feeder with the feeder ID included in the component supply position shifting data which is read from the storage, and, in a case in which the feeder IDs do not match, calculates the shift amount of the component supply position of the corresponding tape feeder and updates the supply position shifting data. The component mounter mounts the components onto a board based on the updated component supply position shifting data.

2 Claims, 12 Drawing Sheets

12  CARRIAGE
15  STORAGE
16  COMPONENT
31  SUCTION NOZZLE

| 1 | COMPONENT MOUNTING SYSTEM |
| 2 | COMPONENT MOUNTING LINE |
| 4 | EXTERNAL SET-UP DEVICE |
| M2, M3, M4 | COMPONENT MOUNTER |

| 8 | BOARD |
| 10 | TAPE FEEDER |
| 30 | MOUNTING HEAD |
| 32 | FIRST RECOGNITION CAMERA |

| 12 | CARRIAGE |
| 15 | STORAGE |
| 16 | COMPONENT |
| 31 | SUCTION NOZZLE |

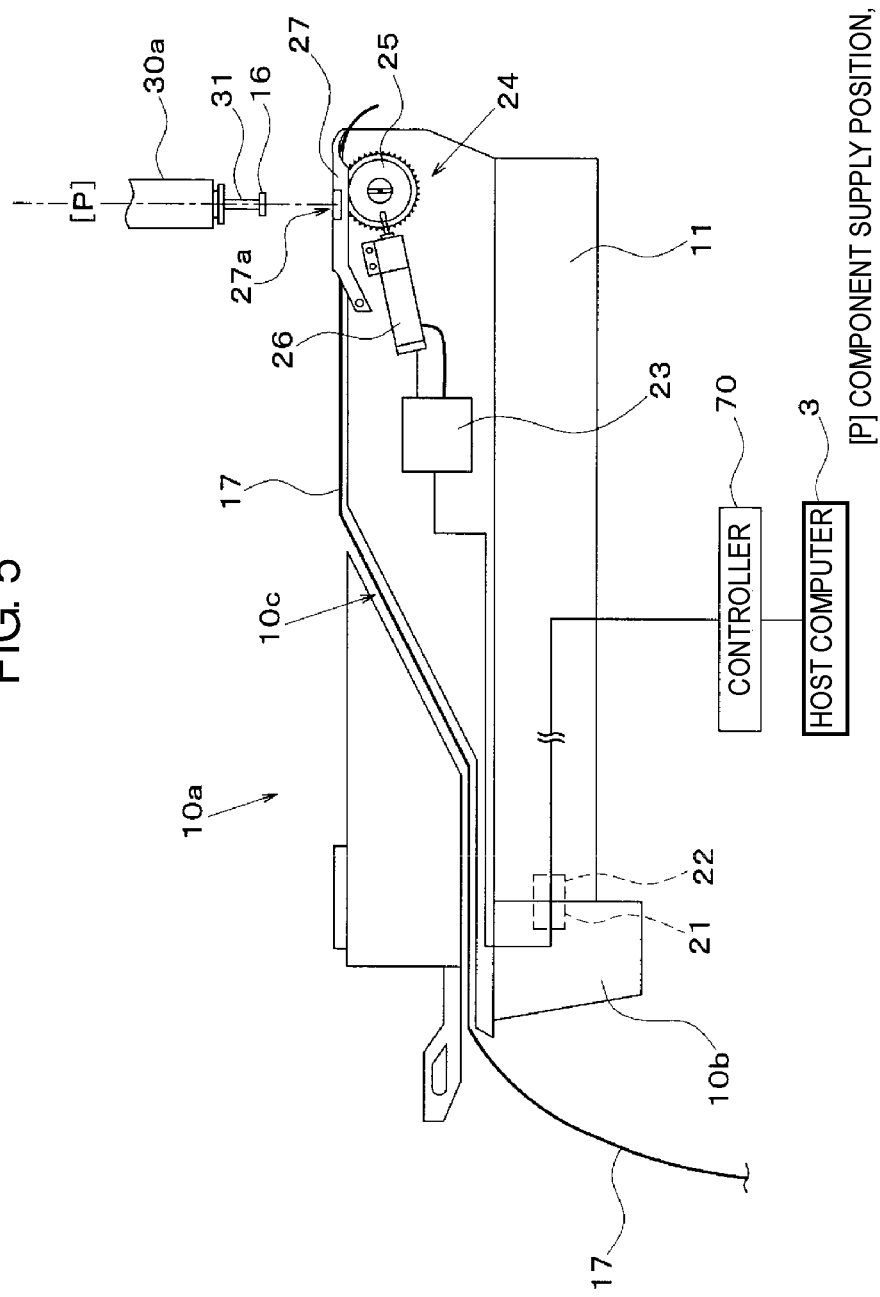

45   THIRD RECOGNITION CAMERA

66   SUPPLY POSITION SHIFTING DATA

COMPONENT MOUNTING METHOD IN COMPONENT MOUNTING SYSTEM

BACKGROUND OF THE INVENTION

1. Field of the Invention

The present invention relates to a component mounting system including a component mounting line which is formed by linking a plurality of component mounters which mount components on a board, and relates to a component mounting method in the component mounting system.

2. Description of the Related Art

In a component mounter which mounts a component held by a suction nozzle that is attached to the mounting head onto a board, a tape feeder is widely used as a part feeder which continually supplies components to the mounting head. A plurality of the tape feeders are disposed on a carriage which can be freely attached to and detached from the component mounter. The tape feeder supplies a component to a predetermined component supply position by intermittently feeding a carrier tape, the suction nozzle picks up the component which is supplied to the component supply position and mounts the component onto the board.

In the component mounter, there is a case in which shifting is generated in the component supply position of the tape feeder, caused by a manufacturing error, an assembly error, or the like of the tape feeder. When the component supply position is shifted, the suction nozzle may not be able to accurately suck the component and a mounting fault may occur. Therefore, before starting production, supply position shifting data indicating the shift amount of the component supply position is created by imaging the component supply position of the tape feeder, and work of teaching of the suction position of the suction nozzle is performed based on the data.

Incidentally, how the model switching time which arises from the set-up changing work for producing the next model scheduled for production is shortened, is important in improving the productivity in a system in which a plurality of models are produced continually using the component mounter. However, the creation of the supply position shifting data as an item of set-up changing work requires a fixed amount of time, since it is necessary to image the component supply position of each individual tape feeder. Therefore, in the related art, a method is proposed in which the supply position shifting data is created in advance using a position detector provided externally to the component mounter of the set-up changing target (for example, refer to PTL 1).

In the example illustrated in PTL 1, before switching the model, the carriage used for the next model scheduled for production is attached to the position detector, and the component supply position is imaged together with the tape feeder disposed on the carriage. The supply position shifting data (correction data) including the information obtained by calculating the shift amount from the normal component supply position to which the components are to be supplied is created. If a carriage is attached to the component mounter of the set-up changing target in the set-up changing work performed after the creation of the supply position shifting data, the component mounter teaches the suction position of the suction nozzle based on the supply position shifting data which is stored in the carriage. In this manner, by creating the supply position shifting data in advance using a device external to the component mounter, it is possible to reduce the model switching time and improve the productivity.

CITATION LIST

Patent Literature

PTL 1: Japanese Patent Unexamined Publication No. 8-181488

SUMMARY OF THE INVENTION

A component mounting system according to a first aspect of the invention includes: a component mounting line formed by linking a plurality of component mounters which pick up components supplied to component supply positions by tape feeders disposed on a carriage, and mount the components onto a board using a suction nozzle which is attached to a mounting head; an external set-up device to which the carriage scheduled to be attached to one of the component mounters of a set-up changing target is attachable; and a storage. The external set-up device includes: a first imaging device which images the component supply positions of the tape feeders disposed on the carriage; and a calculator which calculates a shift amount of each of the component supply positions of the tape feeders based on an image of each of the component supply positions which is captured by the first imaging device. The storage stores supply position shifting data in which the shift amount of each of the component supply positions of the tape feeders calculated by the calculator is related to a feeder address and a feeder ID of each of the tape feeders. The one of the component mounters which is the set-up changing target includes: a second imaging device which images the component supply positions of the tape feeders disposed on the carriage which is removed from the external set-up device and is attached to the one of the component mounters which is the set-up changing target; and a comparator which, for every feeder address, compares the feeder ID of each of the tape feeders disposed on the carriage with the feeder ID included in the component supply position shifting data which is read from the storage.

A component mounting method in a component mounting system according to a second aspect of the invention includes: a component mounting line formed by linking a plurality of component mounters which pick up components supplied to component supply positions by a plurality of tape feeders disposed on a carriage, and mount the components onto a board using a suction nozzle which is attached to a mounting head; and an external set-up device to which the carriage that is scheduled to be attached to one of the component mounters which is a set-up changing target is attachable in a detachable manner. The method includes: imaging the component supply positions of the tape feeders disposed on the carriage, in a state in which the carriage scheduled to be attached to the one of the component mounters of the set-up changing target is attached to the external set-up device; calculating a shift amount of the component supply position of each tape feeder based on an image of the component supply position which is captured in the imaging; storing supply position shifting data in which the shift amount calculated in the calculating is related to a feeder address and a feeder ID of each tape feeder; and comparing the feeder ID of each of the tape feeders disposed on the carriage, with the feeder ID included in the component supply position shifting data in a state in which the carriage removed from the external set-up device is attached to the one of the component mounters of the set-up changing target.

Accordingly, it is possible to shorten the model changing time, and it is possible to correctly determine whether or not to use the supply position shifting data.

BRIEF DESCRIPTION OF DRAWINGS

FIG. 5 is an explanatory diagram of the structure of the tape feeder which is set in the component mounter that configures the component mounting system according to the embodiment of the present invention;

DETAILED DESCRIPTION OF THE PREFERRED EMBODIMENT

Before describing the embodiment of the present invention, a concise description will be given of the problems in the device of the related art. In the related art including JP-A-8-181488, the following problem can occur since the supply position shifting data, which is created by the device external to the component mounter of the set-up changing target, is applied, as it is, to the teaching of the suction position. It is not possible to attach the carriage to the component mounter while the component mounter of the set-up changing target is operating in order to produce a different model. For example, during this period, there is a case in which the tape feeder for which the supply position shifting data has already been created is removed from the carriage for some reason, and a different tape feeder is attached instead. In this case, since the teaching of the suction position in relation to the different tape feeder is performed based on the supply position shifting data of the removed tape feeder, the suction nozzle may not accurately suck the component and a mounting fault may occur. In this manner, in the related art, there is a problem in that it is not possible to correctly determine whether or not to use the supply position shifting data during the switching of the model.

Therefore, an object of the disclosure is to provide a component mounting system capable of shortening the model changing time and capable of correctly determining whether or not to use the supply position shifting data, and a component mounting method of the component mounting system.

Figure 1:
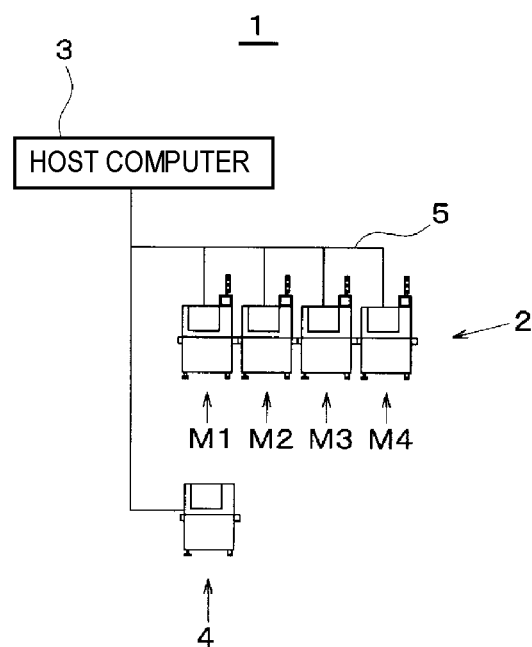
FIG. 1 is an overall configuration diagram of a component mounting system according to an embodiment of the present invention.

First, description will be given of the component mounting system according to the present embodiment with reference to FIG. 1. Component mounting system 1 has a function of mounting a component onto a board, and is configured to include component mounting line 2, host computer 3, external set-up device 4, and communication network 5 which connects component mounting line 2, host computer 3, and external set-up device 4 such that communication therebetween is possible. A plurality of component mounting lines 2 may be provided.

Component mounting line 2 is configured to include printer M1 and a plurality of component mounters M2, M3, and M4 which are disposed to be linked up in the transport direction of the board. Printer M1 prints solder paste onto lands provided on the board. Component mounters M2 to M4 mount components onto the board onto which the solder paste is printed. Host computer 3 manages and controls component mounting line 2 and external set-up device 4. External set-up device 4 performs, outside of the component mounting line 2, the set-up changing work which is necessary when switching the model of the board being produced in component mounting line 2.

Figure 2:
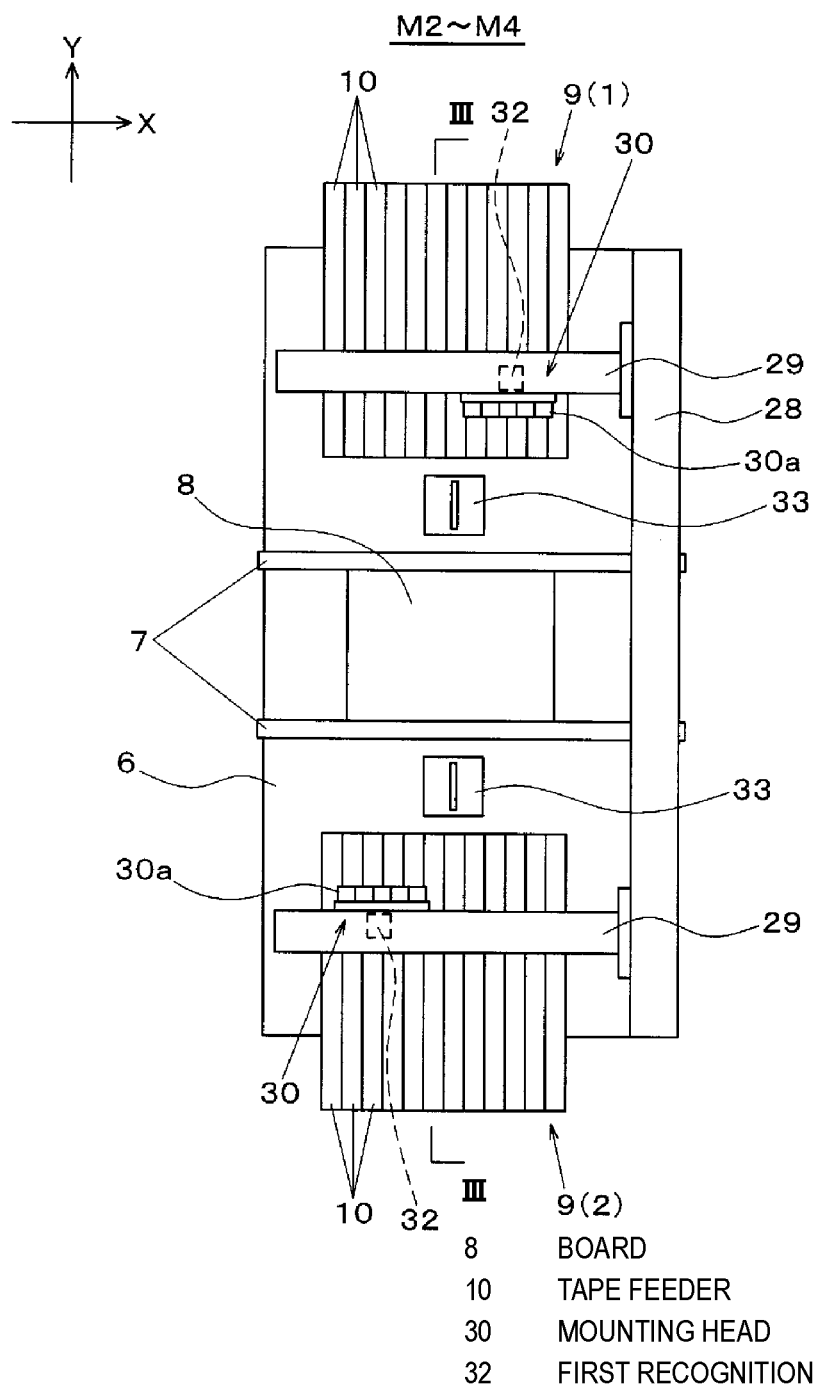
FIG. 2 is a plan view of a component mounter which configures the component mounting system according to the embodiment of the present invention.
Figure 3:
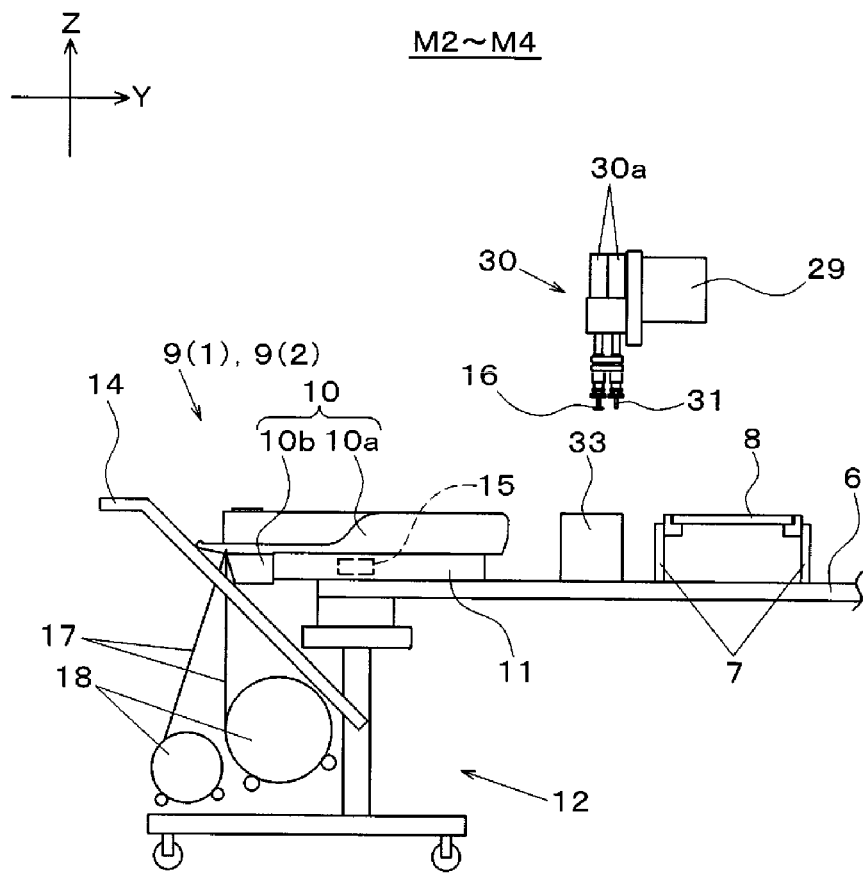
FIG. 3 is a partial view illustrating the component mounter which configures the component mounting system according to the embodiment of the present invention.

Next, description will be given of component mounter M2 with reference to FIGS. 2 to 5. Component mounters M3 and M4 both have the same structure as component mounter M2. FIG. 3 partially illustrates the cross-section taken along III-III in FIG. 2. Hereinafter, the transport direction of the board will be defined as the X direction, and a direction perpendicular to the X direction within a horizontal plane will be defined as the Y direction, and a direction perpendicular to the XY plane will be defined as the Z direction.

Board transport mechanism 7 provided with a pair of transport conveyors extending in the X direction is provided on the top surface of table 6. Board transport mechanism 7 transports board 8, and positions board 8 in a predetermined working position. First feeder disposition zone 9(1) and second feeder disposition zone 9(2) are provided at positions on each side of board transport mechanism 7 in the Y direction, respectively. In FIG. 3, carriage 12 is attached to each feeder disposition zone 9(1) and 9(2) in a detachable manner. Carriage 12 is in a state in which a plurality of tape feeders 10 are mounted to feeder base 11 in advance. The position of carriage 12 is fixed by clamping feeder base 11 to table 6. Accordingly, tape feeders 10 are disposed in a state of being lined up in the X direction in each feeder disposition zone 9(1) and 9(2) (FIG. 2). Carriage 12 is provided with handle 14, and handle 14 is gripped by an operator when moving carriage 12.

Feeder addresses for specifying the mounting positions of tape feeders 10 are set in feeder base 11, and tape feeders 10 are mounted in positions corresponding to individual feeder addresses. Carriage 12 is provided with storage 15. Various data relating to tape feeders 10 mounted in feeder base 11 is stored in storage 15.

Figure 4A:
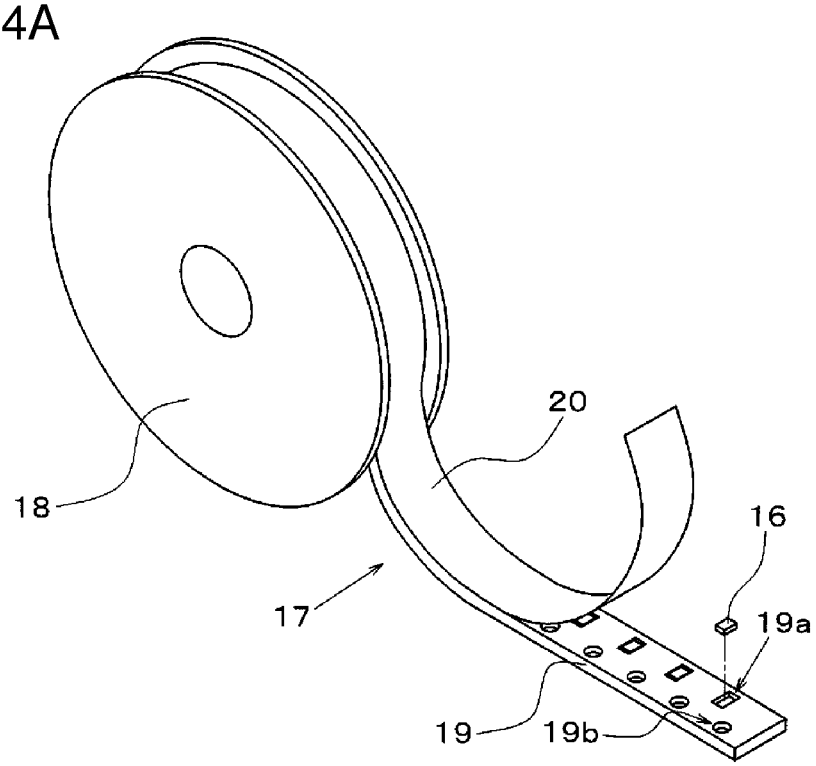
FIG. 4A is a perspective view of a supply reel which stores a carrier tape by winding the carrier tape according to the embodiment of the present invention.
Figure 4B:
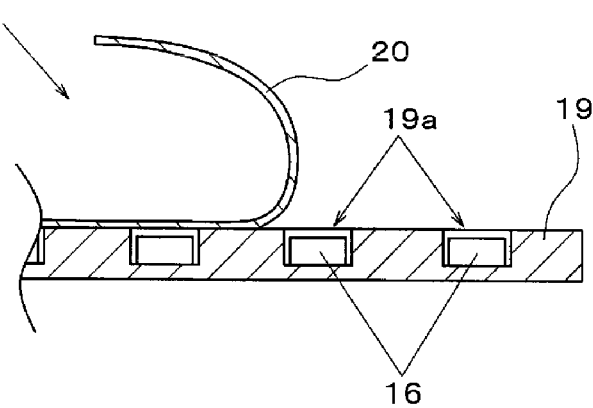
FIG. 4B is a partial cross-sectional diagram of the carrier tape according to the embodiment of the present invention.

Supply reels 18 which store carrier tapes 17 holding a plurality of components 16 in a wound state are held in carriage 12 to rotate freely. In FIGS. 4A and 4B, carrier tape 17 is configured to include base tape 19 and top tape 20. Recessed pockets 19a that store components 16 are formed in base tape 19 in the longitudinal direction at a fixed pitch, and top tape 20 seals the top surface of base tape 19. Holes 19b are formed in one side of base tape 19 at a fixed pitch.

Next, description will be given of the configuration of tape feeder 10 with reference to FIG. 5. Tape feeder 10 is provided with main body 10a, and mounting section 10b which is provided in a protruding state, protruding downward from the bottom surface of main body 10a. Mounting section 10b is provided with first connector 21. In a state in which tape feeder 10 is mounted to feeder base 11, first connector 21 and second connector 22 which is provided in feeder base 11 are mated. In this state, by fixing carriage 12 to table 6, storage 15 which is provided on carriage 12, feeder controller 23 which is provided on tape feeder 10, and controller 70 (refer to FIG. 7) which is provided in component mounter M2 are electrically connected to each other. Accordingly, feeder controller 23 can control tape feeder 10 based on commands from controller 70. Feeder controller 23 is provided with a storage, and feeder IDs and the like which are identification information of individual tape feeders 10 are stored in the storage.

Tape runway 10c which guides carrier tape 17 pulled out from supply reel 18 and loaded into main body 10a is provided on the inside of main body 10a. Tape feed mechanism 24 is installed on the downstream side (the right side of the paper surface) of the tape runway 10c in the tape feed direction. Tape feed mechanism 24 is configured to include sprocket 25 and drive motor 26 which drives sprocket 25 to rotate intermittently. Drive motor 26 is controlled by feeder controller 23. Sprocket 25 intermittently feeds carrier tape 17 by rotating in a state in which a plurality of feed pins provided on the outer circumferential surface and holes 19b of base tape 19 are engaged with each other. Accordingly, component 16 which is held in carrier tape 17 is supplied to component supply position [P] which is set at the downstream side of tape feeder 10. In a state in which carriage 12 is attached to component mounter M2, component supply position [P] of component 16 which is supplied by tape feeder 10 on carriage 12 is set, in advance, to XY coordinates using an apparatus origin as a reference.

Tape retaining member 27 is provided above tape feed mechanism 24. Carrier tape 17 which is pulled out from supply reel 18 is guided in a state of being retained from above by tape retaining member 27. Opening 27a is formed in tape retaining member 27 in a location corresponding to component supply position [P]. Component 16 which is supplied to component supply Position [P] is picked up by suction nozzle 31 (described later) via opening 27a. Tape feeder 10 is provided with a top tape collection mechanism (not shown), and the top tape collection mechanism pulls top tape 20 which is peeled from base tape 19 to the rear side via the end portion of the front side of opening 27a to collect top tape 20. Accordingly, component 16 in pocket 19a is supplied to component supply position [P] in an exposed state.

In FIG. 2, Y-axis beam 28 is provided on the end portion of table 6 in the X direction, and two X-axis beams 29 are provided on Y-axis beam 28 to move freely in the Y direction. Mounting head 30 is mounted on each individual X-axis beam 29 to move freely in the X direction. Mounting head 30 moves in the horizontal directions due to the driving of Y-axis beam 28 and X-axis beam 29. Mounting head 30 is formed of a plurality of unit heads 30a, and a plurality of suction nozzles 31, each of which is capable of sucking and holding component 16, is attached to the bottom end portion of each individual unit head 30a. Suction nozzle 31 sucks and picks up component 16 which is supplied to component supply position [P] and mounts component 16 onto board 8. The suction position of suction nozzle 31 is set to the center in the horizontal plane of component 16 which is supplied to component supply position [P].

There is a case in which component supply position [P] is shifted from the normal position, which is set in advance, due to a manufacturing error or an assembly error of tape feeder 10. When shifting occurs in component supply position [P], there is a concern that suction nozzle 31 cannot accurately suck component 16 and that suction faults will occur. In component mounting system 1 according to the present embodiment, before carriage 12 is attached to component mounter M2 in order to switch the model to be produced, the supply position shifting data indicating the shift amount of component supply position [P] of tape feeder 10 is created in advance using external set-up device 4 (described later).

Mounting head 30 is provided with first recognition camera 32 (a second imaging device), the imaging visual field of which faces downward. First recognition camera 32 moves freely together with mounting head 30 and images board marks (not shown) which are formed on board 8 positioned in the working position, and images component supply position [P] of tape feeder 10 through opening 27a of retaining member 27. In other words, first recognition camera 32 (the second imaging device) images component supply positions [P] of tape feeders 10, of which the plurality are arranged on carriage 12. In table 6, second recognition camera 33, the imaging visual field of which faces upward, is arranged between board transport mechanism 7 and each feeder disposition zone 9(1) and 9(2). Second recognition camera 33 images component 16, from below, which is held in mounting head 30 which moves above second recognition camera 33.

As described above, component mounters M2 to M4 pick up components 16 which are supplied to component supply positions [P] of tape feeders 10 arranged on carriage 12, by using suction nozzle 31 which is attached to mounting head 30, and mount components 16 onto board 8. In component mounting line 2, a plurality of component mounters M2 to M4 are linked together.

Next, description will be given of external set-up device 4 with reference to FIGS. 6A and 6B. FIG. 6B partially illustrates the cross-section along the line VIB-VIB of FIG. 6A. Feeder disposition zone 42 is provided on one side of table 41. Carriage 12 scheduled to be attached to component mounters M2 to M4 of set-up changing targets is attached to feeder disposition zone 42 in a freely detachable manner. In other words, as described using component mounter M2, the position of carriage 12 is fixed by clamping feeder base 11 to table 41. In the state in which the position of carriage 12 is fixed, storage 15 which is provided in carriage 12, feeder controller 23, and controller 60 (FIG. 7) which is provided in external set-up device 4, are electrically connected to each other. Accordingly, feeder controller 23 can control tape feeder 10 based on the commands from controller 60. In this manner, external set-up device 4 is capable of attaching carriage 12 scheduled to be attached to component mounters M2 to M4 of the set-up changing targets.

Figure 6A:
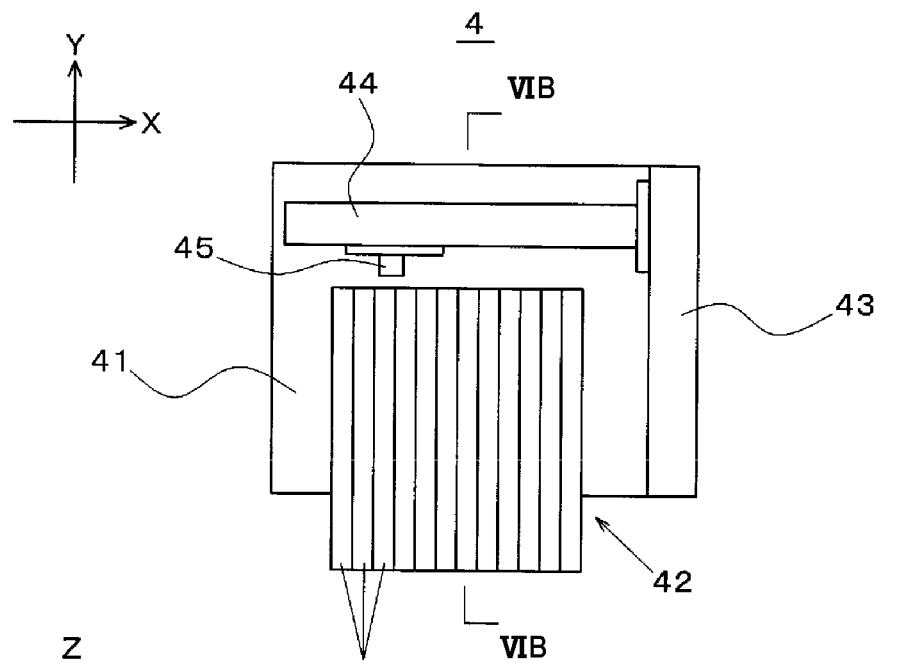
FIG. 6A is a plan view of an external set-up device which configures the component mounting system according to the embodiment of the present invention.
Figure 6B:
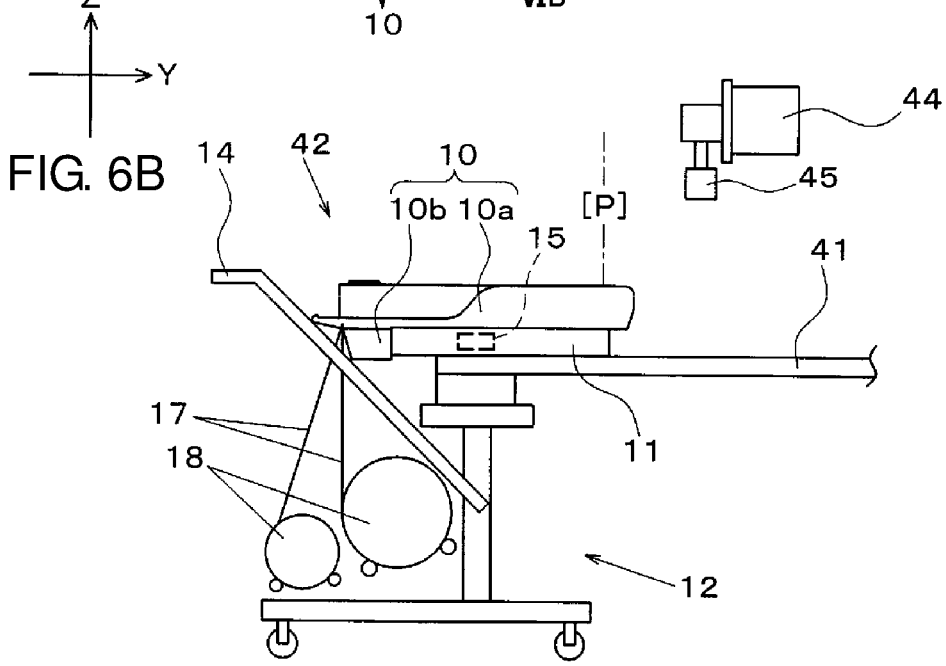
FIG. 6B is a partial view illustrating the external set-up device which configures the component mounting system according to the embodiment of the present invention.

In FIG. 6A, Y-axis beam 43 is provided on the end portion of table 41 in the X direction, and X-axis beam 44 is provided on Y-axis beam 43 to move freely in the Y direction. Third recognition camera 45 (a first imaging device), the imaging visual field of which faces downward, is mounted to X-axis beam 44 to move freely in the X direction. Third recognition camera 45 moves in the horizontal directions due to the driving of Y-axis beam 43 and X-axis beam 44. Accordingly, third recognition camera 45 moves to above component supply position [P] of tape feeder 10 and, at this position, images component supply position [P] through opening 27a of tape retaining member 27. In other words, third recognition camera 45 (the first imaging device) images component supply positions [P] of tape feeders 10 arranged on carriage 12.

Figure 7:
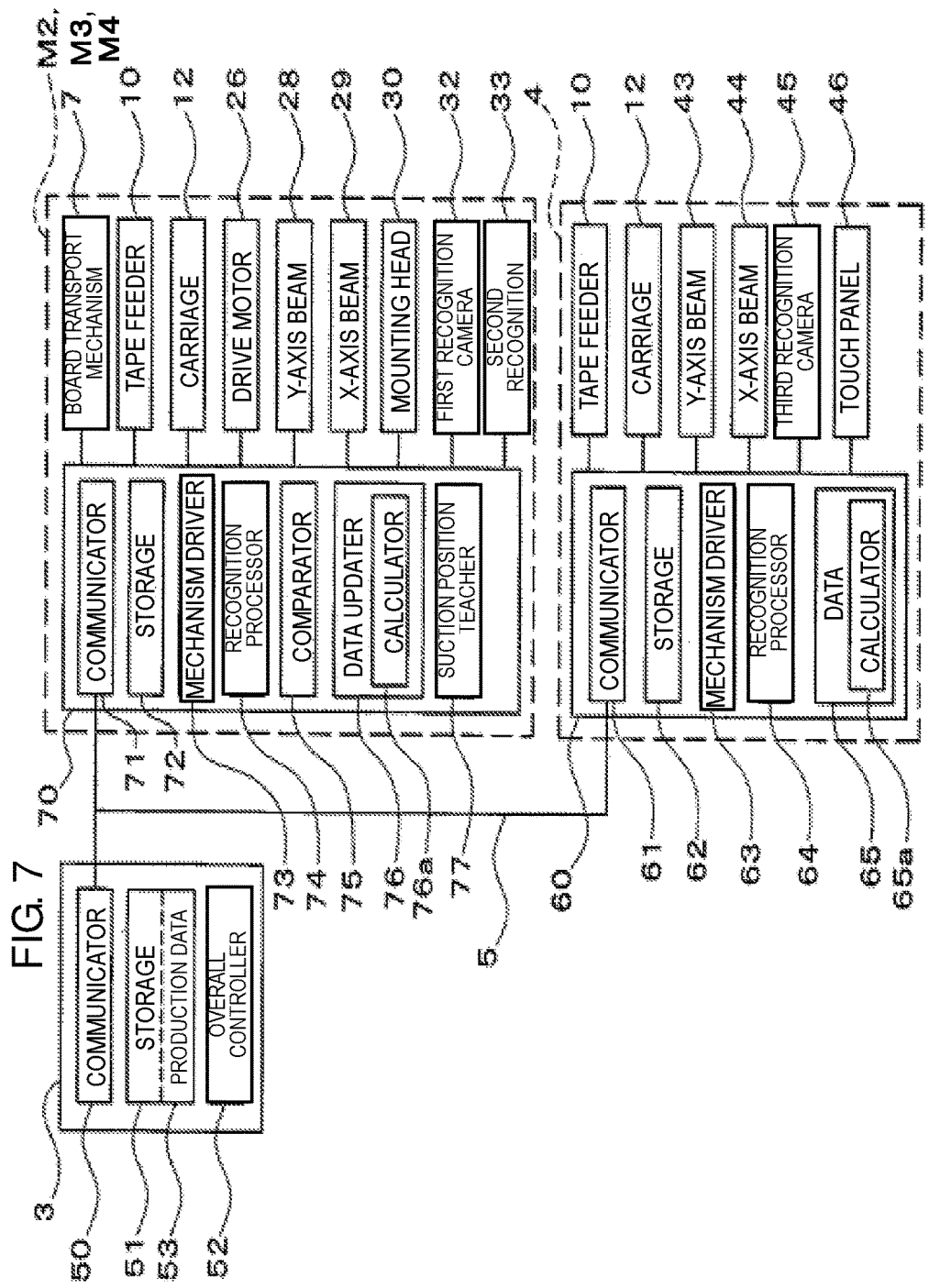
FIG. 7 is a block diagram illustrating a control system of the component mounting system according to the embodiment of the present invention.

External set-up device 4 is provided with touch panel 46 (FIG. 7). Touch panel 46 functions as a display which displays a guidance screen or the like for creating the supply position shifting data (described later). Touch panel 46 also functions as an operation and input section for performing predetermined operations and input on external set-up device 4.

Next, description will be given of the configuration of the control system of component mounting system 1 with reference to FIG. 7. Host computer 3 is configured to include communicator 50, storage 51, and overall controller 52. Controller 60 which is provided in external set-up device 4 is configured to include communicator 61, storage 62, mechanism driver 63, recognition processor 64, and data creator 65. External set-up device 4 is connected to tape feeder 10, carriage 12, Y-axis beam 43, X-axis beam 44, third recognition camera 45, and touch panel 46. Controller 70 which is provided in component mounters M2 to M4 is configured to include communicator 71, storage 72, mechanism driver 73, recognition processor 74, comparator 75, data updater 76, suction position teacher 77. Controller 70 is connected to board transport mechanism 7, tape feeder 10, carriage 12, drive motor 26, Y-axis beam 28, X-axis beam 29, mounting head 30, first recognition camera 32, and second recognition camera 33.

Communicator 50 of host computer 3 is connected to communicator 61 of external set-up device 4 and communicators 71 of component mounters M2 to M4 via communication network 5, and performs transfer of control signals and various data. Storage 51 stores production data 53 which is necessary for the production of board 8. Overall controller 52 manages and controls the apparatuses which form component mounting line 2 and external set-up device 4.

Figure 8A:
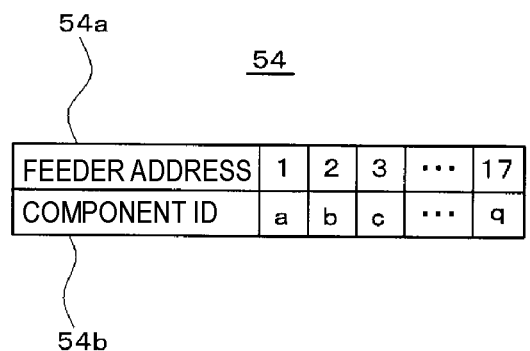
FIG. 8A is a diagram illustrating disposition data according to the embodiment of the present invention.

FIG. 8A illustrates an example of disposition data 54 which is contained in production data 53. Disposition data 54 indicates disposition information of components 16 in each feeder disposition zone 9(1) and 9(2) of component mounters M2 to M4, and is formed by relating "feeder address" 54a to "component ID" 54b. Controllers 70 of component mounters M2 to M4 perform component lookup work of whether or not a predetermined feeder address matches the component ID of component 16, which is supplied by tape feeder 10 actually mounted to the position corresponding to the feeder address, by referring to disposition data 54.

Storage 62 of external set-up device 4 stores production data 53 or the like which is read from host computer 3. Mechanism driver 63 is controlled by controller 60 to drive tape feeder 10, Y-axis beam 43, and X-axis beam 44. Accordingly, a tape feed operation by tape feeder 10 and movement of third recognition camera 45 in the horizontal directions are performed. Recognition processor 64 performs recognition processing on an image of component supply position [P] which is imaged by third recognition camera 45. Accordingly, component 16 which is supplied to component supply position [P] and pocket 19a in which component 16 is stored are detected.

Figure 8B:
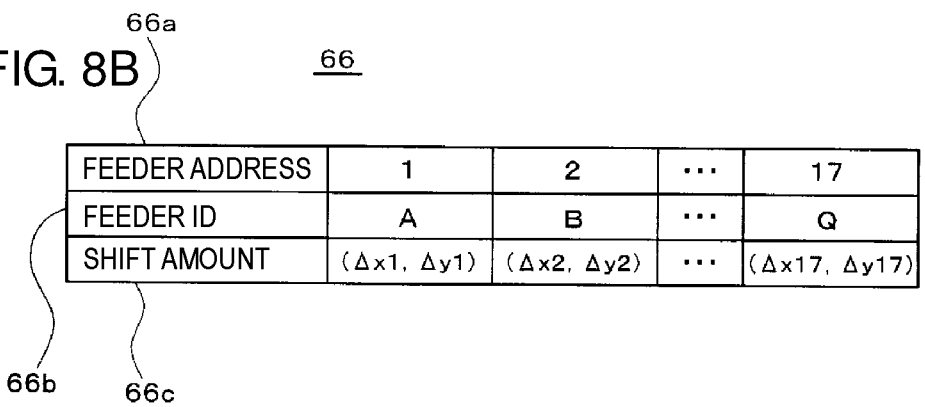
FIG. 8B is a diagram illustrating supply position shifting data according to the embodiment of the present invention.

Data creator 65 performs processes for creating supply position shifting data 66 illustrated in FIG. 8B, and is provided with calculator 65a as an internal processing function. Supply position shifting data 66 is configured to relate "feeder address" 66a to "feeder ID 66b" and "shift amount" 66c. "Feeder address" 66a indicates a mounting position of tape feeder 10 which is disposed on carriage 12. "Feeder ID" 66b indicates unique identification information of each tape feeder 10. "shift amount" 66c indicates the shift amount ($\Delta$x, $\Delta$y) from the normal position of component supply position [P] of tape feeder 10.

Figure 9:
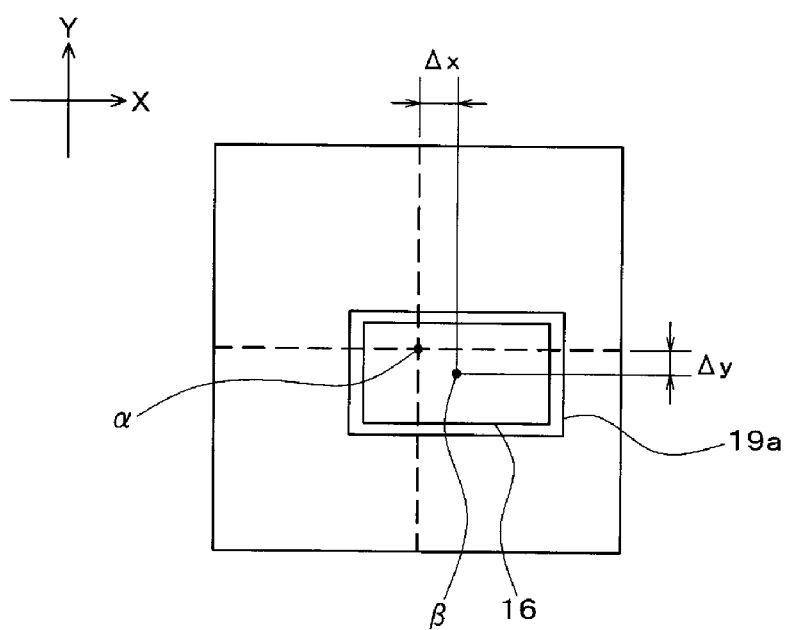
FIG. 9 is a view illustrating an imaging visual field of a third recognition camera provided in the external set-up device which is included in the component mounting line according to the embodiment of the present invention.

FIG. 9 illustrates the imaging visual field when third recognition camera 45 moves to above retaining member 27 (opening 27a) corresponding to component supply position [P]. Calculator 65a calculates the shift amount ($\Delta$x, $\Delta$y) between center $\alpha$ of the imaging visual field of third recognition camera 45 and center $\beta$ in the horizontal plane of pocket 19a storing component 16 that is supplied to component supply position [P] based on images acquired by third recognition camera 45. The shift amount which is calculated at this time is the shift amount of component supply position [P]. When shifting does not occur in component supply position [P], center $\alpha$ of the imaging visual field and center $\beta$ in the horizontal plane of pocket 19a match each other. In this manner, calculator 65a calculates the shift amount of component supply position [P] of component 16 of each tape feeder 10 based on images of component supply position [P] which are captured by third recognition camera 45 (the first imaging device).

Storage 72 of component mounters M2 to M4 store production data 53 or the like which is read from host computer 3. Mechanism driver 73 is controlled by controller 70 to control board transport mechanism 7, tape feeder 10, drive motor 26, Y-axis beam 28, X-axis beam 29, mounting head 30, and the like. Accordingly, the transport operation of board 8, the tape feed operation of tape feeder 10, the mounting operation of component 16, and the like are performed.

By subjecting the images acquired by first recognition camera 32 and second recognition camera 33 to a recognition process, recognition processor 74 detects the board marks, component 16 which is supplied to component supply position [P], pocket 19a which stores component 16, and component 16 which is held in mounting head 30. The detection results of the board marks and component 16 are used when aligning mounting head 30 with board 8 during the mounting of component 16.

Comparator 75 compares the feeder ID of tape feeder 10 disposed on carriage 12 with the feeder ID included in supply position shifting data 66 corresponding to carriage 12 for each feeder address, and determines whether or not the feeder IDs match. Supply position shifting data 66 is created by external set-up device 4.

Data updater 76 performs processes for updating supply position shifting data 66 which is created by external set-up device 4, and is provided with calculator 76a as an internal processing function. Calculator 76a calculates the shift amount of component supply position [P] of tape feeder 10 for which comparator 75 determines that the feeder IDs do not match, based on the images acquired via the imaging by first recognition camera 32. Data updater 76 rewrites "feeder ID" 66b and "shift amount" 66c which are contained in supply position shifting data 66 which is created by external set-up device 4 based on the calculated shift amount.

Suction position teacher 77 teaches the suction position of suction nozzle 31 based on the shift amount of component supply position [P] of each tape feeder 10 indicated in supply position shifting data 66. Accordingly, tape feeder 10 intermittently feeds carrier tape 17, taking shift amount Δy in the Y direction of component supply position [P] indicated in supply position shifting data 66 into account. Suction nozzle 31 moves, taking shift amount Δx in the X direction of component supply position [P] which is indicated in supply position shifting data 66 into account. Accordingly, even in a case in which shifting occurs in component supply position [P], suction nozzle 31 is capable of accurately sucking component 16.

Figure 10:
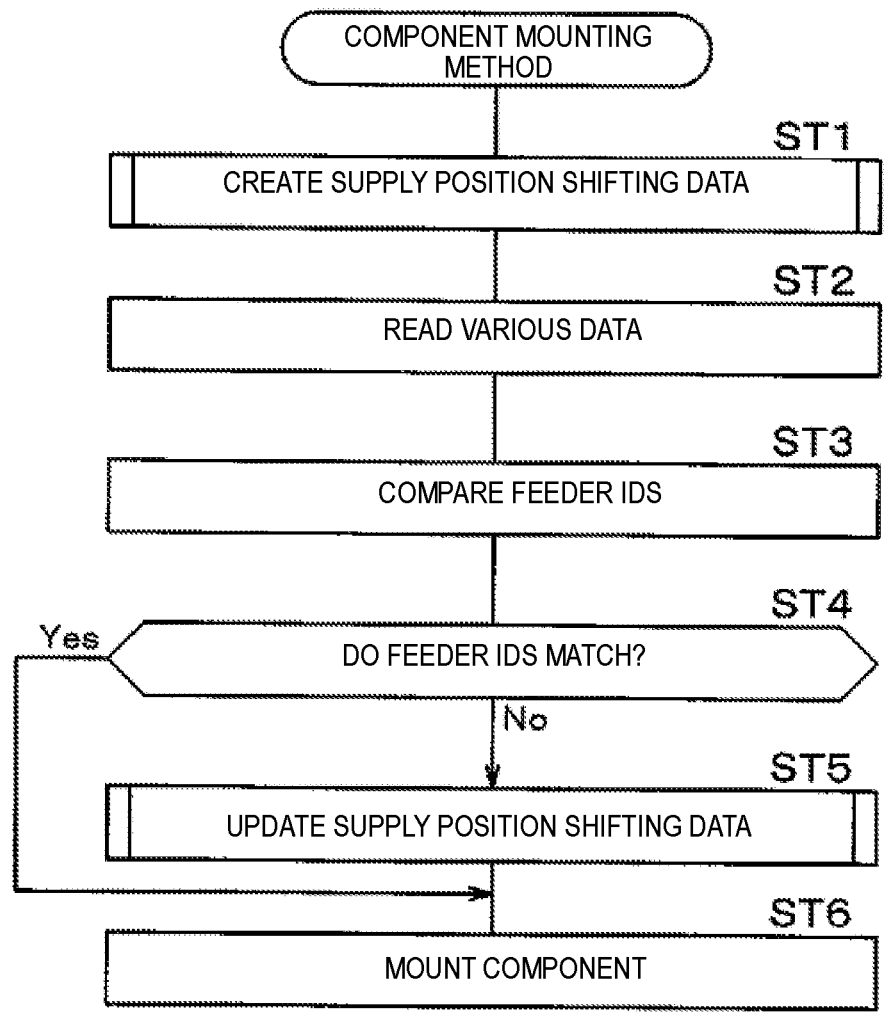
FIG. 10 is a flowchart of a component mounting method according to the embodiment of the present invention.
Figure 11:
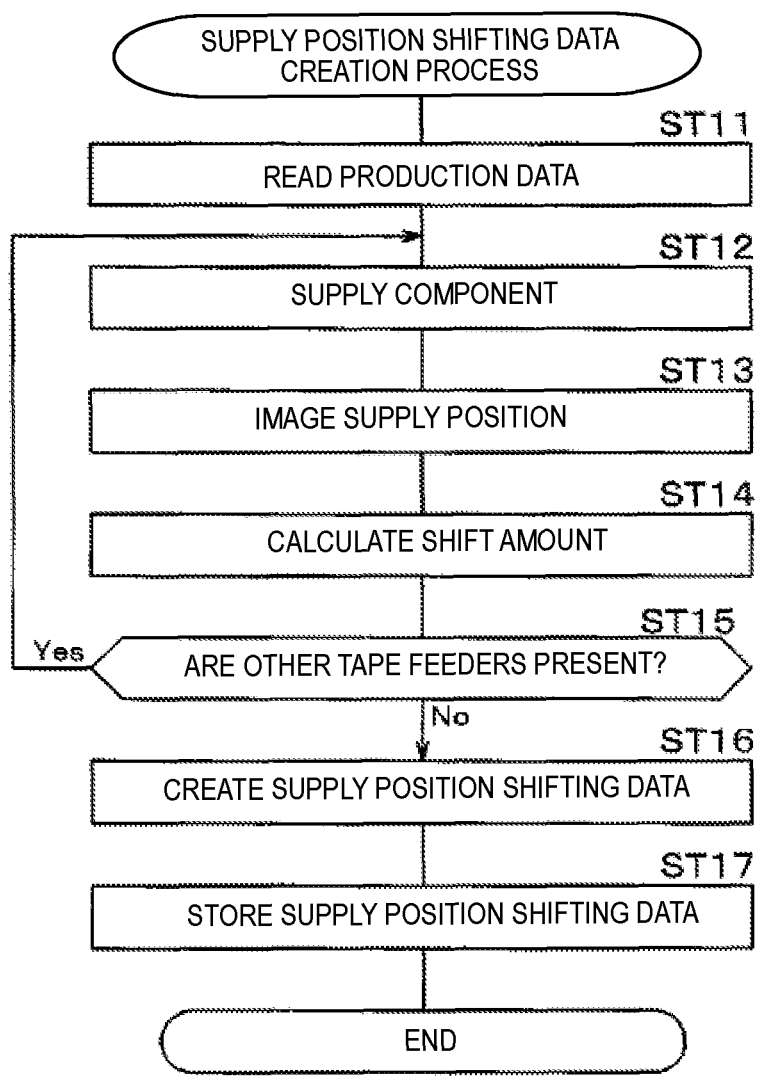
FIG. 11 is a flowchart of a creation process of the supply position shifting data according to the embodiment of the present invention.
Figure 12:
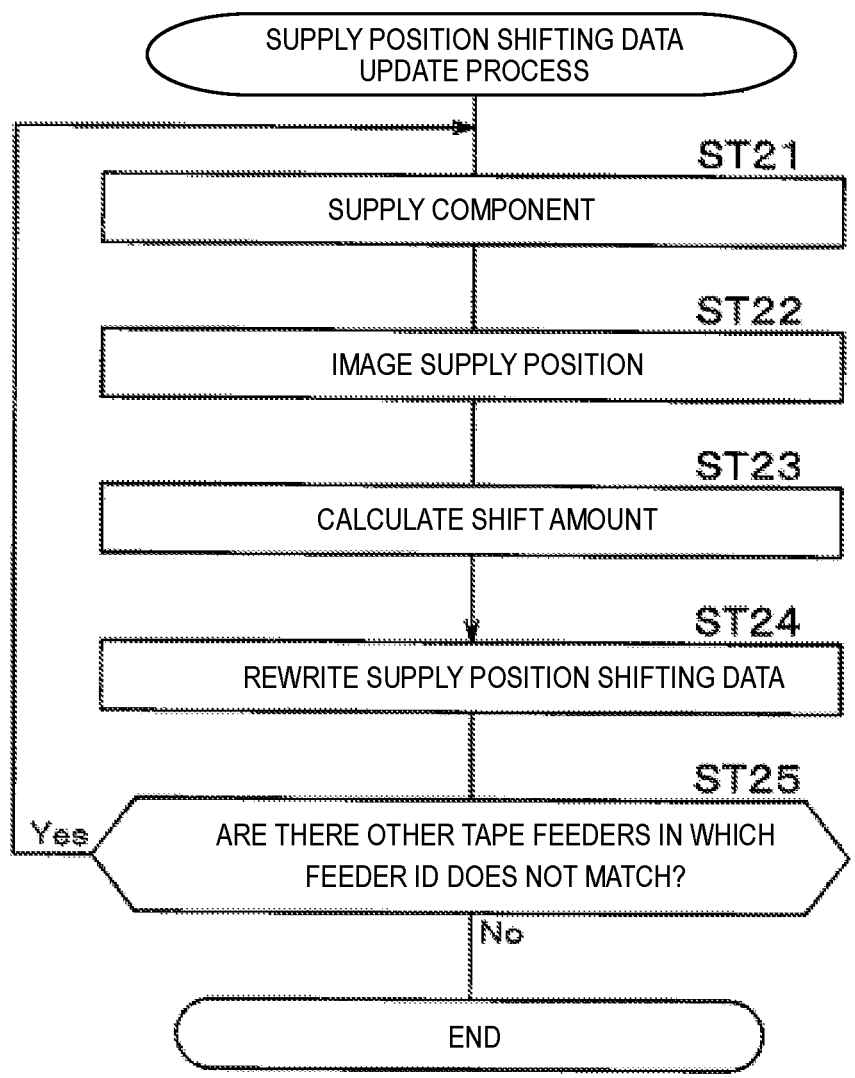
FIG. 12 is a flowchart of an update process of the supply position shifting data according to the embodiment of the present invention.

Component mounting system 1 according to the present embodiment is configured as described above. Next, description will be given of the component mounting method in component mounting system 1 with reference to the flow charts of FIG. 10 to FIG. 12. As illustrated in FIG. 10, supply position shifting data 66 corresponding to carriage 12 scheduled to be attached to component mounters M2 to M4 of the set-up changing targets is created (ST1: supply position shifting data creation step). Description will be given of the creation process of supply position shifting data 66 with reference to FIG. 11. Before performing the process, the operator attached carriage 12 to external set-up device 4 in advance.

Controller 60 of external set-up device 4 reads production data 53 corresponding to carriage 12 from host computer 3 based on the content which is input by the operator (ST11: production data reading step). Next, controller 60 outputs a tape feed command to feeder controller 23 of predetermined tape feeder 10 based on production data 53. Tape feeder 10 which receives the tape feed command intermittently feeds carrier tape 17 to supply component 16 to component supply position [P] (ST12: component supply process). Next, third recognition camera 45 moves to above retaining member 27 corresponding to component supply position [P] and images component supply position [P] (ST13: imaging process). Accordingly, the image containing component 16 which is supplied to component supply position [P] and pocket 19a in which component 16 is stored is acquired. In other words, in this process (ST13), third recognition camera 45 (the first imaging device) images component supply positions [P] of tape feeders 10 arranged on carriage 12 attached to external set-up device 4.

Next, calculator 65a calculates the shift amount (Δx, Δy) of component supply position [P] of each tape feeder 10 based on images of component supply position [P] which are captured by third recognition camera 45 (the first imaging device) (ST14: calculation process).

Next, controller 60 determines whether or not there is another tape feeder 10 for which the shift amount of component supply position [P] has not been calculated (ST15: determination process). In a case in which controller 60 determines that there is another tape feeder 10 (the case of "Yes" indicated in FIG. 11), the process returns to the component supply process (ST12). In a case in which it is determined that there is not another tape feeder 10 (the case of "No" indicated in FIG. 11), data creator 65 creates supply position shifting data 66 based on the shift amount of component supply position [P] of each tape feeder 10 which is acquired (ST16: supply position shifting data creation process). In other words, data creator 65 creates supply position shifting data 66 in which shift amount of component supply position [P] calculated by calculator 65a is related to the feeder address and the feeder ID of tape feeder 10.

Next, controller 60 causes storage 15 of carriage 12 to store supply position shifting data 66 (ST17: storage process). In other words, in this process (ST17), storage 15 of carriage 12 stores supply position shifting data 66 in which the shift amount calculated in the calculation step (ST14) is related to the feeder address and the feeder ID of tape feeder 10. Supply position shifting data 66 may be stored in storage 51 of host computer 3. After completing the processes described above, the creation process of supply position shifting data 66 ends. Supply position shifting data 66 is created for all carriages 12, which are scheduled to be attached to component mounters M2 to M4 which are the set-up changing targets, as targets. Carriages 12 for which supply position shifting data 66 has been created are subsequently attached to component mounters M2 to M4 which are the set-up changing targets.

Once carriages 12 are attached to component mounters M2 to M4 which are the set-up targets, controllers 70 of component mounters M2 to M4 read various data from carriage 12 and tape feeder 10 on carriage 12 (ST2: data reading process). In other words, controller 70 reads the feeder ID and the feeder address, related to each other, from the storage of feeder controller 23 which is provided in each individual tape feeder 10. Controller 70 reads supply position shifting data 66 from storage 15 of carriage 12. In a case in which supply position shifting data 66 is stored in storage 51 of host computer 3, controller 70 reads supply position shifting data 66 from storage 51.

Next, comparator 75 compares the feeder IDs for each feeder address based on the various data that is read (ST3: comparison process). In other words, in this process (ST3), in a state in which carriages 12 removed from external set-up device 4 are attached to component mounters M2 to M4 which are the set-up changing targets, the feeder IDs of tape feeders 10 disposed on carriage 12, and the feeder IDs contained in supply position shifting data 66 are compared with each other. Comparator 75 determines whether or not both the feeder IDs match for each feeder address (ST4: determination process).

As a result of the comparison, in a case in which it is determined that the feeder IDs do not match at the predetermined feeder address (the case of "No" indicated in FIG. 10), data updater 76 updates supply position shifting data 66 (ST5: data update process). Description will be given of the update process of supply position shifting data 66 with reference to FIG. 12. First, controller 70 outputs a tape feed command to feeder controller 23 of tape feeder 10 for which it is determined that the feeder IDs do not match. Tape feeder 10 which receives the tape feed command intermittently feeds carrier tape 17 to supply component 16 to component supply position [P] (ST21: component supply process). Next, first recognition camera 32 moves to above retaining member 27 corresponding to component supply position [P] and, at this position, images component supply position [P] (ST22: imaging process). In other words, first recognition camera 32 images component supply position [P] of tape feeder 10 disposed on carriage 12 which is removed from external set-up device 4 and attached to component mounters M2 to M4 of the set-up changing targets. Next, calculator 76a calculates the shift amount (Δx, Δy) of component supply position [P] based on images which are acquired by first recognition camera 32 (ST23: calculation process).

Next, data updater 76 rewrites the various information contained in supply position shifting data 66 based on the calculated shift amount of component supply position [P] of component 16 of tape feeder 10 (ST24: rewriting process). In other words, data updater 76 rewrites "feeder ID" 66*b* and "shift amount" 66*c* corresponding to "feeder address" 66*a* which is the calculation target of the shift amount of component supply position [P]. Accordingly, the feeder ID and the actual shift amount of component supply position [P] of tape feeder 10 which is disposed on carriage 12 match the feeder ID indicated by supply position shifting data 66 and the shift amount of component supply position [P]. Next, controller 70 determines whether there is another tape feeder 10 in which the feeder IDs do not match (ST25: determination process). In a case in which controller 70 determines that there is another tape feeder 10 in which the feeder IDs do not match (the case of "Yes" indicated in FIG. 12), the process returns to the component supply process (ST21) and corresponding tape feeder 10 supplies component 16 to component supply position [P]. In a case in which controller 70 determines that there is no other tape feeder 10 in which the feeder IDs do not match (the case of "No" indicated in FIG. 12), the data update process is ended.

In this manner, in the data updating process (ST5), as a result of the comparison of the feeder IDs of tape feeder 10*s* disposed on carriage 12, and the feeder IDs contained in supply position shifting data 66, in a case in which the feeder IDs do not match, supply position shifting data 66 is updated by calculating the shift amount of component supply position [P] of tape feeder 10 in which the feeder IDs do not match based on the image which is obtained by first recognition camera 32 imaging component supply position [P] of tape feeder 10 in which the feeder IDs do not match. Here, as explained in the above-mentioned problems in the device of the related art, during the period between supply position shifting data creation step ST1 and data reading process ST2, for example, there is a case in which the tape feeder for which the supply position shifting data has already been created is removed from the carriage for some reason, and a different tape feeder is attached instead. In such a case, it happens that the feeder IDs of tape feeder 10 and the feeder IDs contained in supply position shifting data 66 do not match.

As a result of the comparison of the feeder IDs, in a case in which it is determined that the feeder IDs match at all of the feeder addresses (the case of "Yes" indicated in FIG. 10), or, after supply position shifting data 66 is updated in (ST5), the mounting operation of component 16 is executed (ST6: mounting process). In other words, suction nozzle 31 picks up component 16 which is supplied to component supply position [P] by tape feeder 10 and mounts component 16 onto board 8. At this time, tape feeder 10 intermittently feeds carrier tape 17, taking shift amount Δy in the Y direction of component supply position [P] indicated in supply position shifting data 66 into account. Suction nozzle 31 moves, taking shift amount Δx in the X direction of component supply position [P] which is indicated in supply position shifting data 66 into account.

In a case in which the supply position shifting data 66 is updated, suction nozzle 31 picks up component 16 and mounts component 16 onto board 8 based on the updated supply position shifting data 66. In a case in which supply position shifting data 66 is not updated, that is, in a case in which, as a result of the comparison of the feeder IDs, the feeder ID of tape feeder 10*s* disposed on carriage 12 removed from external set-up device 4 and attached to component mounters M2 to M4 of the set-up changing targets, matches the feeder ID contained in supply position shifting data 66 which is read from storage 15, suction nozzle 31 picks up component 16 and mounts component 16 onto board 8 based on supply position shifting data 66 which is read from storage 15.

As described above, according to component mounting system 1 and the component mounting method in the present embodiment, in a state in which carriage 12 scheduled to be attached to component mounters M2 to M4 of the set-up changing targets is attached to external set-up device 4, component supply positions [P] of tape feeder 10*s* disposed on carriage 12, are imaged. The shift amount of component supply position [P] of each tape feeder 10 is calculated based on the captured image of component supply position [P], and supply position shifting data in which the calculated shift amount is related to the feeder address and the feeder ID of tape feeder 10 is stored. In a state in which carriage removed from external set-up device 4 is attached to component mounters M2 to M4 of the set-up changing targets, the feeder IDs of tape feeders 10 disposed on carriage 12, and the feeder IDs contained in the supply position shifting data are compared with each other, thus, it is possible to shorten the model switching time and it is possible to correctly determine whether or not to use the supply position shifting data.

As a result of the comparison, in a case in which the feeder IDs do not match, the shift amount of component supply position [P] of tape feeder 10 for which the feeder IDs do not match is calculated based on the image obtained by imaging component supply position [P] of tape feeder 10 for which the feeder IDs do not match, the component supply position shifting data is updated, component 16 is picked up and mounted onto board 8 based on the updated component supply position shifting data, and thus, it is possible to prevent a reduction in productivity caused by suction faults of component 16.

The present invention is not limited to the embodiment described hereunto, and it is possible to change the design within a scope that does not depart from the gist of the invention. For example, in a case in which carriage 12 is not attached to the inside of component mounters M2 to M4, and the inside of component mounters M2 to M4 are feeder disposition zones 9(1) and 9(2) in a vacant state, supply position shifting data 66 may be created using corresponding feeder disposition zones 9(1) and 9(2). In other words, component mounters M2 to M4 may be used as external set-up device 4.

Accordingly, it is possible to shorten the model changing time, it is possible to correctly determine whether or not to use the supply position shifting data, and the present invention is applicable in the mounting field.

What is claimed is:

1. A component mounting method in a component mounting system having: a component mounting line formed by linking a plurality of component mounters which pick up components supplied to component supply positions by a plurality of tape feeders disposed on a carriage, and mount the components onto a board using a suction nozzle which is attached to a mounting head; and an external set-up device to which the carriage that is scheduled to be attached to one of the component mounters which is a set-up changing target is attachable in a detachable manner;

the method comprising:
imaging the component supply positions of the tape feeders disposed on the carriage, in a state in which the carriage scheduled to be attached to the one of the component mounters of the set-up changing target is attached to the external set-up device, calculating a shift amount of the component supply position of each tape feeder based on an image of the component supply position which is captured in the imaging, storing supply position shifting data in which the shift amount calculated in the calculating is related to a feeder address and a feeder ID of each tape feeder, and comparing the feeder ID of each of the tape feeders disposed on the carriage, with the feeder ID included in the component supply position shifting data in a state in which the carriage removed from the external set-up device is attached to the one of the component mounters of the set-up changing target.

2. The component mounting method in the component mounting system of claim 1, further comprising:

in a case in which a result of the comparison in the comparing indicates that the feeder ID do not match, updating the component supply position shifting data by calculating a shift amount of the component supply position of the tape feeder in which the feeder IDs do not match, based on an image which is obtained by imaging the component supply position of the tape feeder in which the feeder IDs do not match, and mounting the components of the tape feeder in which the feeder IDs do not match onto the board by picking up the component based on the updated component supply position shifting data, in a case in which the component supply position shifting data is updated.

\* \* \* \* \*